United States Patent
Tai (10) Patent No.: US 10,426,052 B1
(45) Date of Patent: Sep. 24, 2019

(54) HANDLE, PLUGGABLE MODULE, AND ELECTRONIC APPARATUS

(71) Applicant: ACCTON TECHNOLOGY CORPORATION, Hsinchu (TW)

(72) Inventor: Hung-Feng Tai, Taoyuan (TW)

(73) Assignee: ACCTON TECHNOLOGY CORPORATION, Hsinchu (TW)

(*) Notice: Subject to any disclaimer, the term of this patent is extended or adjusted under 35 U.S.C. 154(b) by 0 days.

(21) Appl. No.: 16/225,401

(22) Filed: Dec. 19, 2018

(30) Foreign Application Priority Data

Jun. 12, 2018 (CN) .................... 2018 2 0908950 U (51) Int. Cl.
| | |
|---|---|
| *H05K 5/02* | (2006.01) |
| *G06F 1/18* | (2006.01) |
| *H05K 7/12* | (2006.01) |
| *H05K 7/10* | (2006.01) |

(52) U.S. Cl.
CPC ............ *H05K 5/023* (2013.01); *G06F 1/18* (2013.01); *H05K 5/0204* (2013.01); *H05K 5/0247* (2013.01); *H05K 5/0286* (2013.01); *H05K 7/10* (2013.01); *H05K 7/12* (2013.01)

(58) Field of Classification Search
None
See application file for complete search history.

(56) References Cited

U.S. PATENT DOCUMENTS

| | | | | |
|---|---|---|---|---|
| 3,861,733 A | * | 1/1975 | Vander Mey | B08B 11/02 294/33 |
| 4,393,540 A | * | 7/1983 | Yamamoto | A45C 13/26 16/422 |
| 4,912,808 A | * | 4/1990 | Blakely | B60N 3/026 16/422 |
| 4,951,176 A | * | 8/1990 | Bergfried | H05K 7/12 174/138 G |
| 5,481,431 A | * | 1/1996 | Siahpolo | G06F 1/184 361/679.31 |
| 5,791,753 A | * | 8/1998 | Paquin | H05K 7/1411 312/223.1 |
| 6,181,549 B1 | * | 1/2001 | Mills | H05K 7/1489 292/114 |
| 6,507,978 B1 | * | 1/2003 | Root | H02B 1/26 16/410 |

(Continued)

*Primary Examiner* — Xanthia C Cunningham
(74) *Attorney, Agent, or Firm* — Lynette Wylie; Apex Juris, PLLC.

(57) ABSTRACT

The inventive subject matter discloses a handle, a pluggable module, and an electronic apparatus. The electronic apparatus includes a frame body and a plurality of pluggable modules. Each of the pluggable modules includes a rack and a handle, wherein the rack is adapted to receive an electronic module. The handle includes two elastic arms and a force-bearing arm, wherein each of the two elastic arms includes a hook section, and the two hook sections are adapted to be engaged with positioning structures of the frame body respectively. The force-bearing arm is connected between the two elastic arms, and the two elastic arms shift toward each other to enable the two hook sections to be detached from the positioning structures when a force is applied to the force-bearing arm. With the aforementioned design, the pluggable module could be instinctively inserted into or removed from the electronic apparatus.

14 Claims, 7 Drawing Sheets

(56) References Cited

U.S. PATENT DOCUMENTS

| | | | | |
|---|---|---|---|---|
| 6,665,908 B1* | 12/2003 | Mease | | H05K 5/0013 16/422 |
| 7,175,470 B2* | 2/2007 | Kangas | | H05K 7/1411 439/160 |
| 7,349,200 B2* | 3/2008 | Hardt | | G06F 1/183 361/679.55 |
| 7,507,103 B1* | 3/2009 | Phillips | | G02B 6/4201 439/352 |
| 7,699,641 B2* | 4/2010 | Bright | | H01R 13/6275 439/352 |
| 8,040,687 B2* | 10/2011 | Pirillis | | H05K 7/1412 361/801 |
| 8,070,242 B2* | 12/2011 | Makabe | | H05K 7/1489 312/223.1 |
| 8,169,783 B2* | 5/2012 | Phillips | | H01R 13/6275 361/728 |
| 8,508,937 B2* | 8/2013 | Chen | | G06F 1/1628 345/179 |
| 8,749,973 B2* | 6/2014 | Nan | | G06F 1/187 16/110.1 |
| 8,944,538 B2* | 2/2015 | Li | | H05K 7/20172 312/223.2 |
| 9,521,774 B2* | 12/2016 | Liang | | H05K 5/0221 |
| 9,795,052 B2* | 10/2017 | Hsiao | | H05K 7/1489 |
| 9,826,658 B1* | 11/2017 | Mao | | H05K 7/1487 |
| D813,008 S* | 3/2018 | Stefnitz | | D8/316 |
| 9,909,338 B1* | 3/2018 | Abrahams | | E05B 1/0015 |
| 9,911,464 B2* | 3/2018 | Jau | | G06F 1/187 |
| 9,915,983 B2* | 3/2018 | Yu | | G06F 1/187 |
| 9,930,795 B2* | 3/2018 | Chang | | H05K 5/023 |
| 10,061,362 B2* | 8/2018 | Jau | | G06F 1/187 |
| 10,168,747 B2* | 1/2019 | Zhu | | G06F 1/187 |
| 10,230,196 B2* | 3/2019 | Phillips | | H01R 13/6275 |
| 10,317,949 B1* | 6/2019 | Lin | | H05K 7/1487 |
| 2004/0017650 A1* | 1/2004 | Liu | | G06F 1/184 361/679.33 |
| 2005/0051672 A1* | 3/2005 | Dean | | G06F 1/184 248/27.1 |
| 2008/0158810 A1* | 7/2008 | Liu | | G06F 1/187 361/679.33 |
| 2009/0080165 A1* | 3/2009 | Barina | | H05K 7/1411 361/747 |
| 2010/0014223 A1* | 1/2010 | Chen | | H05K 5/023 361/679.01 |
| 2010/0223759 A1* | 9/2010 | Baik | | G06F 1/181 16/408 |
| 2011/0273850 A1* | 11/2011 | Chen | | H05K 5/0221 361/726 |
| 2012/0236474 A1* | 9/2012 | Chang | | G06F 1/181 361/679.01 |
| 2012/0257342 A1* | 10/2012 | Shindo | | H05K 5/023 361/679.02 |
| 2013/0176690 A1* | 7/2013 | Sun | | H05K 5/023 361/747 |
| 2014/0184040 A1* | 7/2014 | Li | | H05K 5/023 312/223.1 |
| 2014/0317913 A1* | 10/2014 | Lu | | H05K 5/023 29/762 |
| 2015/0156912 A1* | 6/2015 | Liang | | H05K 5/0221 361/726 |
| 2017/0017276 A1* | 1/2017 | Ganta | | G06F 1/188 |
| 2017/0055360 A1* | 2/2017 | Della Fiora | | H05K 7/1487 |
| 2018/0206351 A1* | 7/2018 | Wu | | H05K 5/0256 |
| 2018/0263131 A1* | 9/2018 | Coenegracht | | H05K 5/061 |

* cited by examiner

HANDLE, PLUGGABLE MODULE, AND ELECTRONIC APPARATUS

BACKGROUND OF THE INVENTION

Technical Field

The present invention is related to a handle structure, an electronic module, and an apparatus, and more particularly to a handle which is instinctively detachable, a pluggable module, and an electronic apparatus.

Description of Related Art

An electronic apparatus usually includes one or a plurality of pluggable electronic modules, wherein the electronic module is usually mounted with a handle which could be held by a user to remove the electronic module from the electronic apparatus. However, for the conventional structure of the electronic apparatus, it is required to release a locked state between the electronic module and the electronic apparatus before removing the electronic module from the electronic apparatus. For example, the electronic module and the electronic apparatus are assembled via a fastening screw, and the user has to utilize a tool to release the fastening screw before detaching the electronic module from the electronic apparatus. The aforementioned design is not convenient for operation due to the complicated assembling procedure, and therefore it is required to provide an improvement for the electronic apparatus having the pluggable electronic modules.

BRIEF SUMMARY OF THE INVENTION

In view of the above, an object of the present invention is to provide a handle, a pluggable module, and an electronic apparatus such that a user could instinctively insert the pluggable module into the electronic apparatus or remove the pluggable module from the electronic apparatus.

To achieve the object mentioned above, the present invention provides a handle. The handle includes two elastic arms and a force-bearing arm, wherein each of the elastic arms includes a hook section to be engaged with a positioning structure of an electronic apparatus, and the force-bearing arm is connected between the two elastic arms. The two elastic arms shift toward each other to enable the two hook sections to be detached from the positioning structures when a force is applied to the force-bearing arm.

To achieve the object mentioned above, the present invention provides a pluggable module. The pluggable module includes a rack and a handle, wherein the rack is adapted to receive an electronic module, and each of two lateral sides of the rack is disposed with a pass-through section. The handle includes two elastic arms and a force-bearing arm, wherein each of the two elastic arms includes a hook section, and the two hook sections respectively pass through the pass-through sections to be engaged with positioning structures of an electronic apparatus; the force-bearing arm is connected between the two elastic arms, and the two elastic arms shift toward each other to enable the two hook sections to be detached from the positioning structures when a force is applied to the force-bearing arm.

To achieve the object mentioned above, the present invention provides an electronic apparatus. The electronic apparatus includes a frame body and a plurality of pluggable modules, wherein the frame body includes a plurality of sockets corresponding to the plurality of pluggable modules, wherein two lateral sections of each of the sockets are respectively formed with a positioning structure. The plurality of pluggable modules are detachably received in the plurality of sockets. Each of the pluggable modules includes a rack and a handle, wherein the rack is adapted to receive an electronic module, and each of two lateral sides of the rack is disposed with a pass-through section. The handle includes two elastic arms and a force-bearing arm. Each of the two elastic arms includes a hook section, wherein the two hook sections respectively pass through the pass-through sections to be engaged with the positioning structures. The force-bearing arm is connected between the two elastic arms, and the two elastic arms shift toward each other to enable the two hook sections to be detached from the positioning structures when a force is applied to the force-bearing arm.

The handle further includes a main body, wherein each of two lateral sections of the main body includes an opening groove which is formed with a sub arm protruding therefrom; the two sub arms are respectively connected to the two elastic arms and respectively connected to two opposite ends of the force-bearing arm as well.

The main body, the two elastic arms, and the force-bearing arm are integrally formed as a monolithic unit.

The main body further comprises a holding arm connected between the two sub arms, and the force-bearing arm is located between the two elastic arms and the holding arm.

One side of the holding arm of the main body away from the two elastic arms is formed with a labelling part.

The two lateral sections of the main body are further respectively disposed with a first positioning part; the rack is further disposed with two second positioning parts to be engaged with the two first positioning parts respectively.

Each of the pass-through sections of the rack includes a first slot and a second slot; the plurality of first slots are adapted to be passed through by the elastic arms respectively, and the second slots are adapted to be passed through by the hook sections respectively.

Each of the racks includes a back plate and two lateral plates, wherein the two lateral plates are respectively connected to two lateral sides of the back plate; the back plate includes two first slots, and each of the two lateral plates includes a second slot.

The advantage of the present invention is that through the aforementioned design of the handle, the pluggable module, and the electronic apparatus, the user could instinctively insert the pluggable module into the electronic apparatus or remove the pluggable module from the electronic apparatus.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
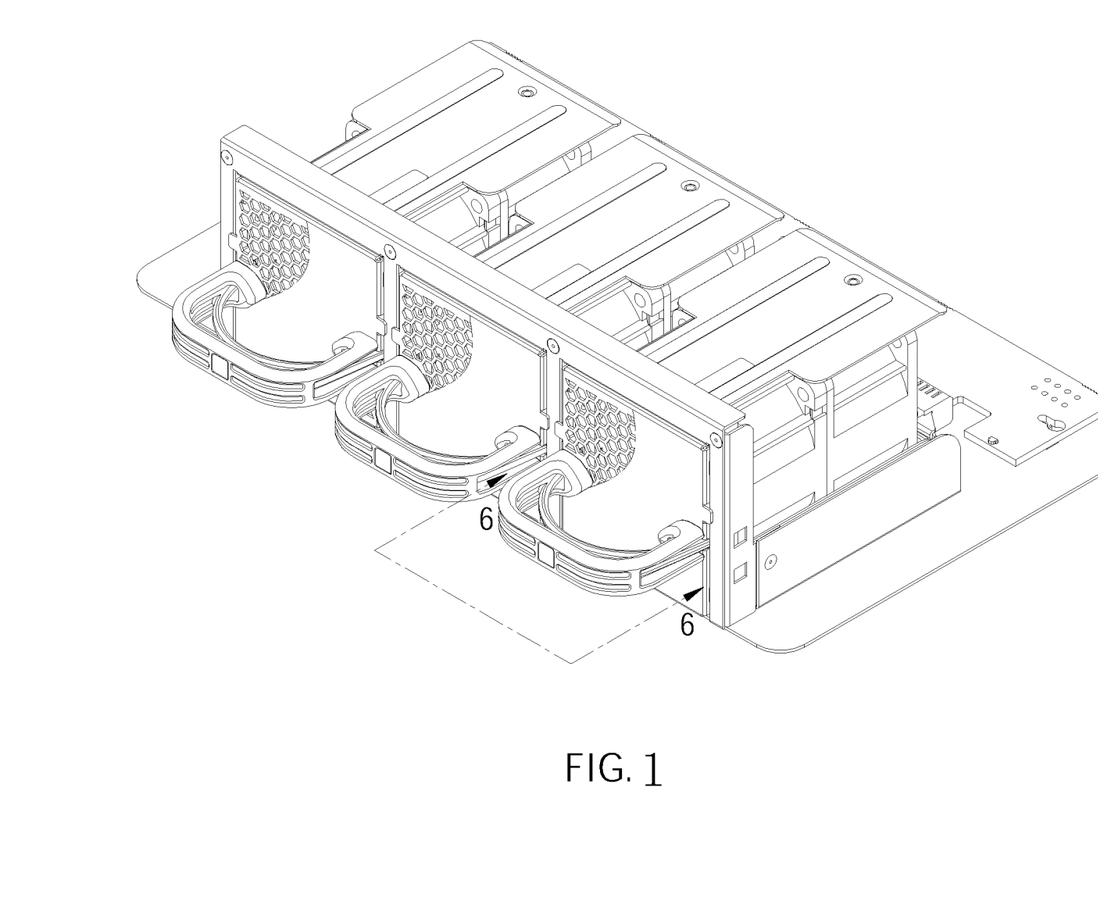
FIG. 1 is a perspective view of an electronic apparatus of an embodiment according to the present invention, wherein in order to illustrate easily, partial meshes are omitted.
Figure 2:
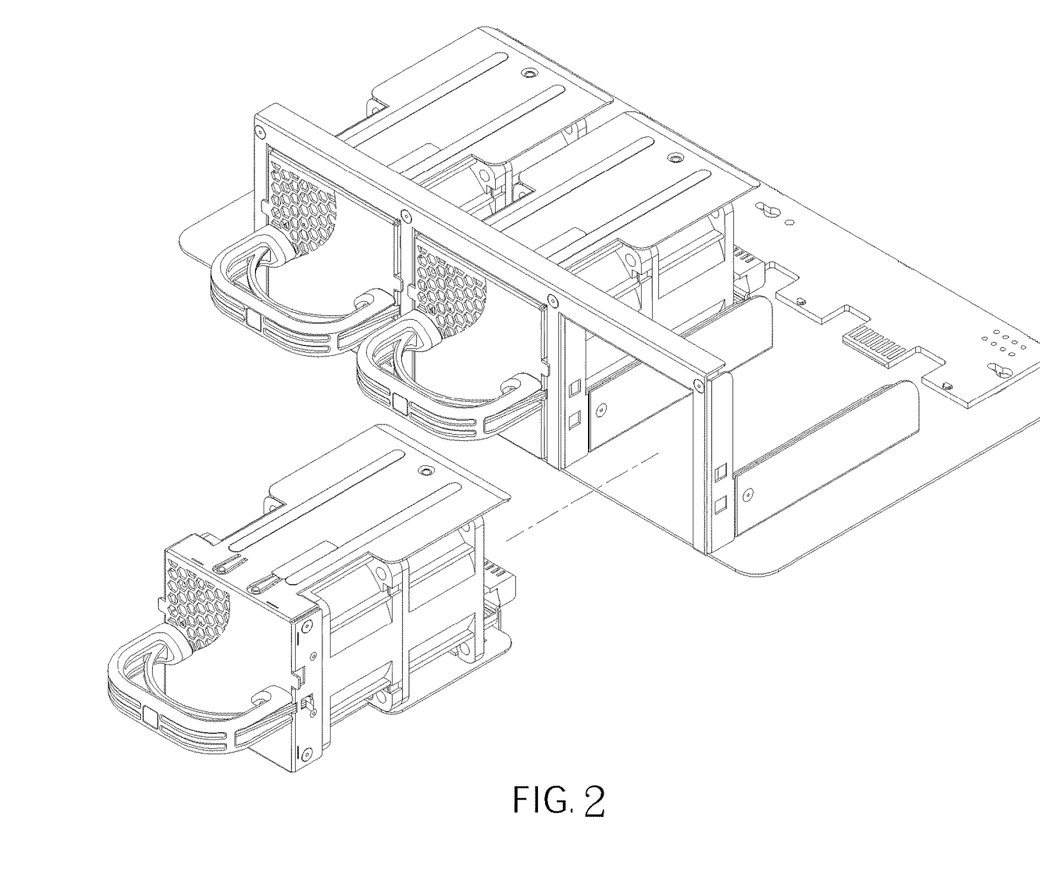
FIG. 2 is an exploded view of the pluggable module and the frame body of FIG. 1, wherein in order to illustrate easily, partial meshes are omitted.

The following illustrative embodiments and drawings are provided to illustrate the disclosure of the present invention, these and other advantages and effects can be clearly understood by persons skilled in the art after reading the disclosure of this specification. Referring to FIG. 1 and FIG. 2, an electronic apparatus 100 of an embodiment according to the present invention includes a frame body 10 and a plurality of pluggable modules 20.

The frame body 10 includes a bottom plate 12 and a plurality of partitions 14 disposed on the bottom plate 12, wherein the plurality of partitions 14 are spaced from one another by a distance; a socket 16 is confined between every two partitions 14 so as to provide plural sockets 16 adapted to be disposed with the pluggable modules 20. Every two lateral partitions 14 at two sides of each socket 16 are respectively formed with a positioning structure. In this embodiment, the positioning structure is a through hole 18 as an example, however, this is not a limitation of the present invention. In other embodiments, the positioning structure could also be, but not limited to, a recess.

Figure 3:
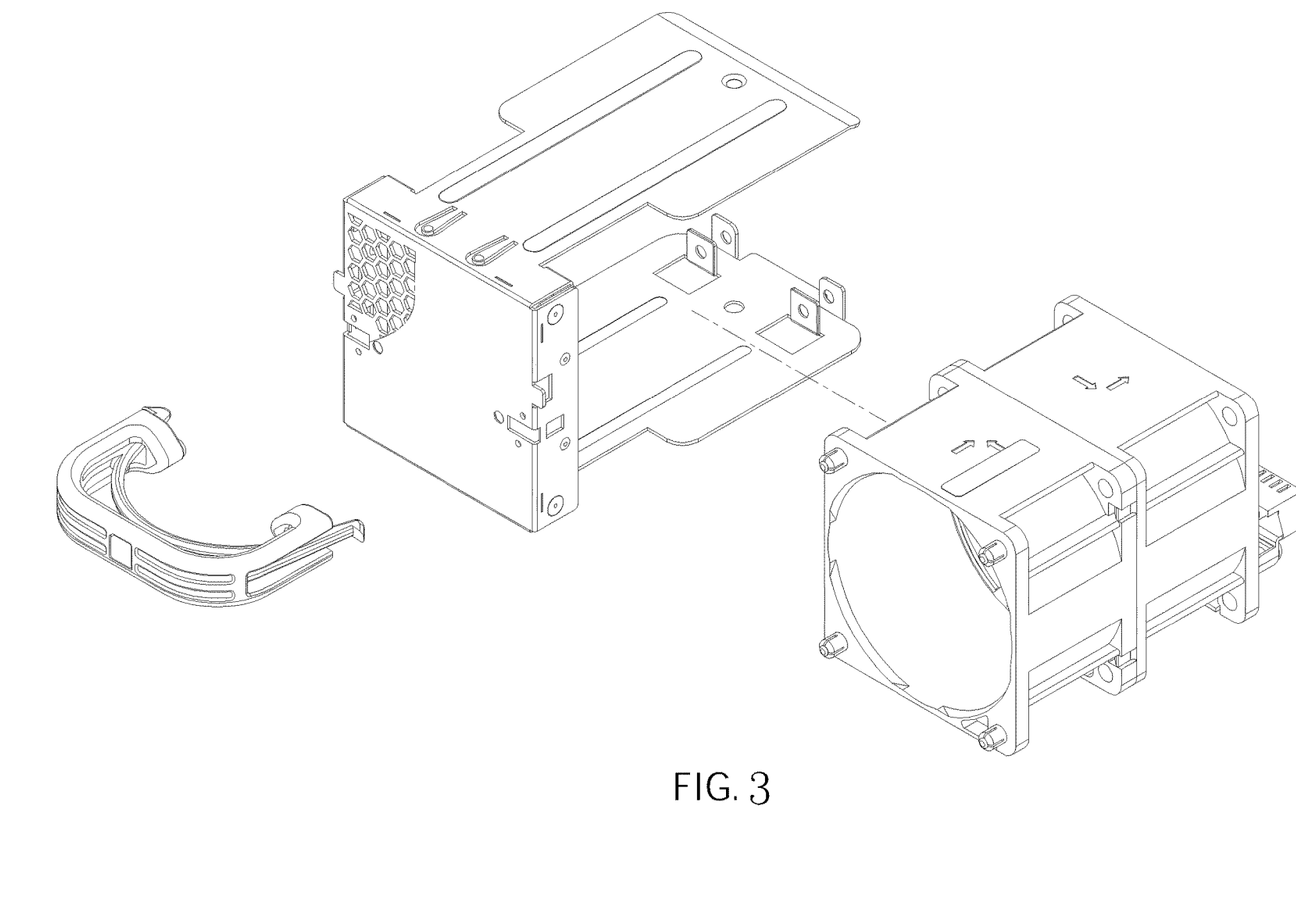
FIG. 3 is an exploded view of the pluggable module of FIG. 1, wherein in order to illustrate easily, partial meshes are omitted.

Referring to FIG. 2 and FIG. 3, each of the pluggable modules 20 includes a rack 30 and a handle 40. The rack 30 is adapted to receive an electronic module 50, wherein the electronic module 50 could be, but not limited to, a fan module, a memory, a hard disk, a display card, a power module, etc. In this embodiment, the electronic module 50 is a fan module as an example.

Each of two lateral sides of the rack 30 is disposed with a pass-through section. In this embodiment, each of the racks 30 includes a back plate 32, two lateral plates 34, and two fixing plates 36, wherein the two lateral plates 34 are respectively connected to two lateral sides of the back plate 32, and the two fixing plates 36 are respectively connected to an upper side and a lower side of the back plate 32. A space enclosed by the two fixing plates 36 is adapted to receive the electronic module 50. In this embodiment, the pass-through section includes a first slot 38 and a second slot 39, wherein the first slot 38 is formed on the back plate 32, and the second slot 39 is formed on the lateral plate 34.

Referring to FIG. 2 to FIG. 5, the handle 40 includes a main body 60, two elastic arms 70, and a force-bearing arm 80, wherein two lateral sections of the main body 60 are respectively connected to the two elastic arms 70. Each of the two elastic arms 70 has one end formed with a hook section 72, and the hook sections 72 respectively pass through the pass-through sections of the rack 30 to be engaged with the positioning structures of the frame body 10. In this embodiment, the hook sections 72 are engaged with the through holes 18, respectively. The force-bearing arm 80 is connected between the two elastic arms 70, and the two elastic arms 70 would shift toward each other when a force is applied to the force-bearing arm 80 such that the hook sections 72 of the two elastic arms 70 could respectively detach from the positioning structures. In this embodiment, the main body 60 includes a holding arm 61, and each of two lateral sections of the holding arm 61 includes an opening groove 62 which is formed with a sub arm 63 protruding therefrom, and the two sub arms 63 are respectively connected to the two elastic arms 70. The two elastic arms 70 respectively pass through the first slots 38 of the rack 30, and the hook sections 72 of the two elastic arms 70 respectively pass through the second slots 39 of the rack 30 and normally extend out of the second slots 39. The force-bearing arm 80 is located between the two elastic arms 70 and the holding arm 61, and two opposite ends of the force-bearing arm 80 are respectively connected to the two sub arms 63. According to the aforementioned design, the force-bearing arm 80 would be restricted by the holding arm 61, thereby providing protection and positioning effects. In more details, deformation of the force-bearing arm 80 could be restricted by the holding arm 61 such that the force-bearing arm 80 would not be over-deformed when a force is applied thereto, and thereby to prevent the force-bearing arm 80 from breaking or falling off when an excessive force is applied to the force-bearing arm 80. Furthermore, the main body 60, the two elastic arms 70, and the force-bearing arm 80 of the handle 40 are integrally formed as a monolithic unit, which provides advantages of convenient assembling and a structure with improved stability and strength. The handle 40 could be manufactured by, but not limited to, injection molding or 3D printing, and could be made of, but not limited to, plastic materials.

Figure 4:
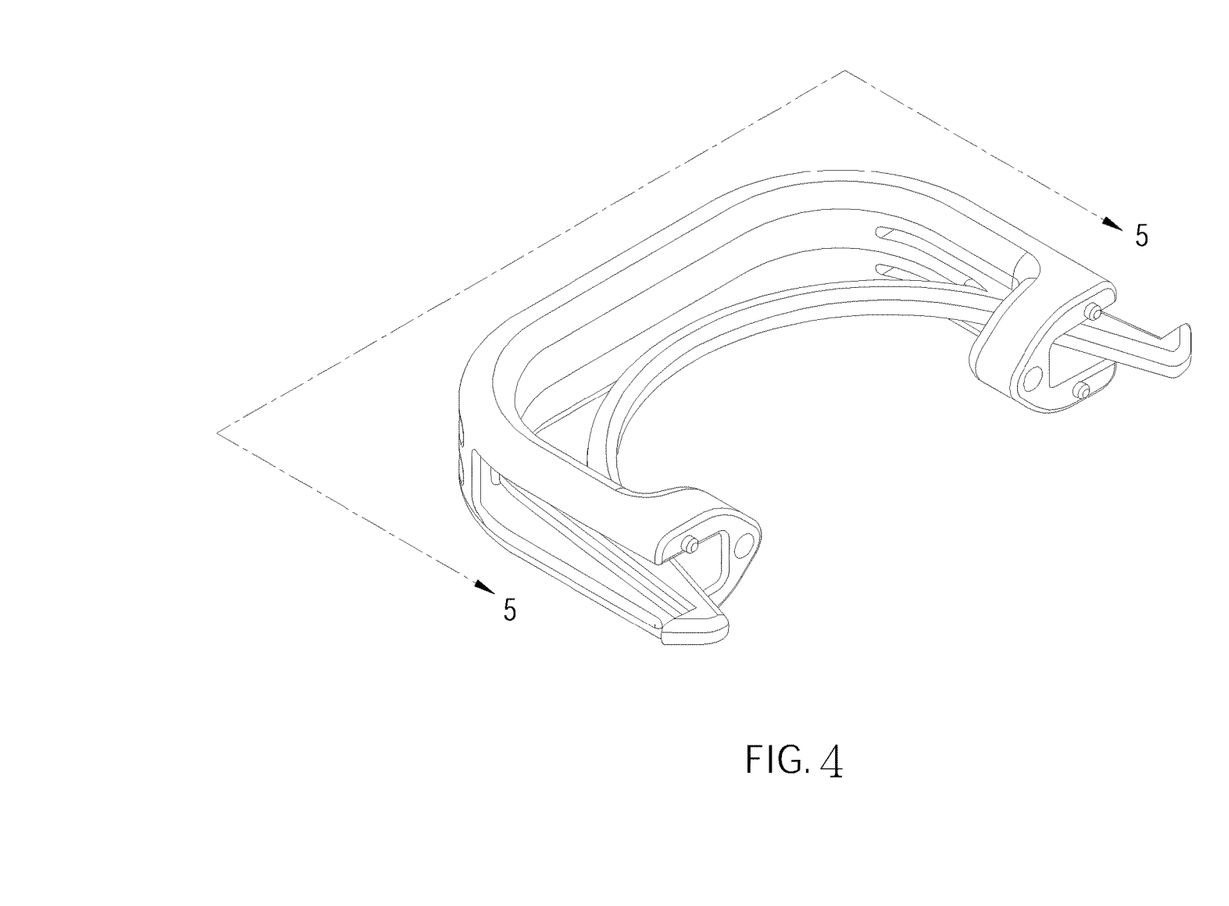
FIG. 4 is a perspective view of the handle of FIG. 1.
Figure 5:
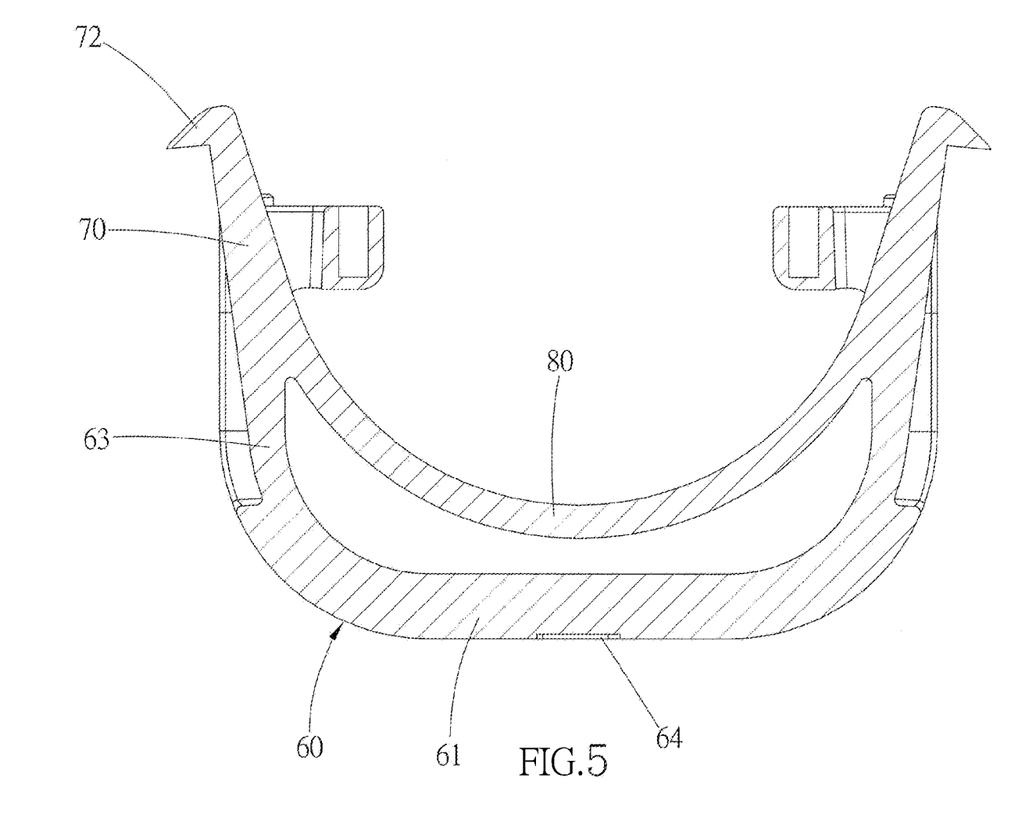
FIG. 5 is a cross-sectional view of the handle of FIG. 4 along line 5-5 of FIG. 4.

Moreover, one side of the holding arm 61 of the main body 60 away from the two elastic arms 70 is formed with a labelling part 64. In this embodiment, the labelling part 64 is a recess as an example, which is adapted to be disposed with a label, wherein the label could be, but not limited to, a trademark. In addition, in an embodiment, the labelling part 64 could be carved directly and disposed without the label.

In this embodiment, each of the two lateral sections of the main body 60 is further disposed with an aperture 65 such that a positioning member 90 could be utilized to fix the handle 40 to the rack 30 by passing the positioning member 90 through an aperture 31 on the back plate 32 of the rack 30 and screwing the positioning member 90 into the aperture 65. It is worth mentioning that the two lateral sections of the main body 60 are respectively disposed with a first positioning part, and the rack 30 is disposed with two second positioning parts corresponding to the first positioning parts, wherein the two second positioning parts are adapted to be engaged with the two first positioning parts respectively such that the handle 40 could only be assembled with the rack 30 in a certain direction. In this embodiment, each of the first positioning parts includes a first protrusion 66 and a second protrusion 67, wherein a distance between the two first protrusions 66 is different from a distance between the two second protrusions 67. The second positioning parts include two first through holes 33 and two second through holes 35 disposed on the two lateral sides of the back plate 32, wherein each first through hole 33 and each second through hole 35 are respectively disposed on two sides of the first slot 38. A distance between the two first through holes 33 is equal to the distance between the two first protrusions 66, and a distance between the two second through holes 35 is equal to the distance between the two second protrusions 67. Hence, it is required for a user to align the two first protrusions 66 with the two first through holes 33 and align the two second protrusions 67 with the two second through holes 35 to proceed assembling, and thereby to assure that a relative position of the handle 40 and the rack 30 could be fixed, and the labelling parts 64 of the handles 40 of the pluggable modules 20 would face toward the same direction, resulting in a neat appearance. In addition, the second positioning parts are not limited to the through holes. In an embodiment, the second positioning parts could also be the recesses. The first positioning parts are not limited to the protrusions. In an embodiment, the first positioning parts could also be the through holes or the recesses, and the second positioning parts could also be the protrusions.

Figure 6:
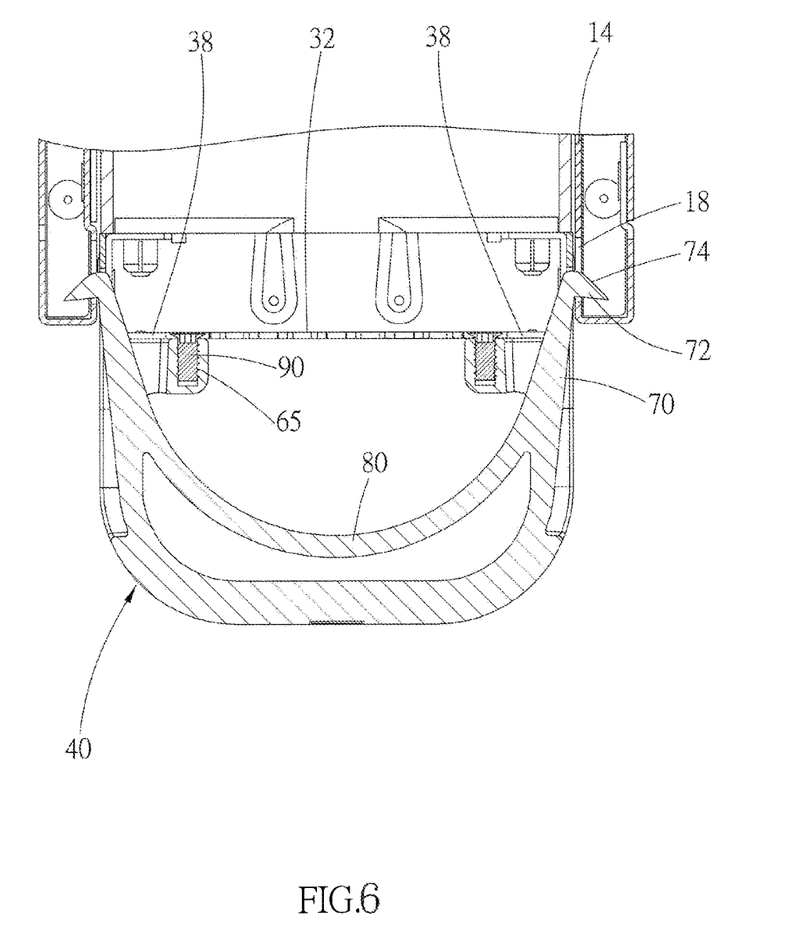
FIG. 6 and FIG. 7 are cross-sectional views of the handle of FIG. 1 along line 6-6 of FIG. 1.
Figure 7:
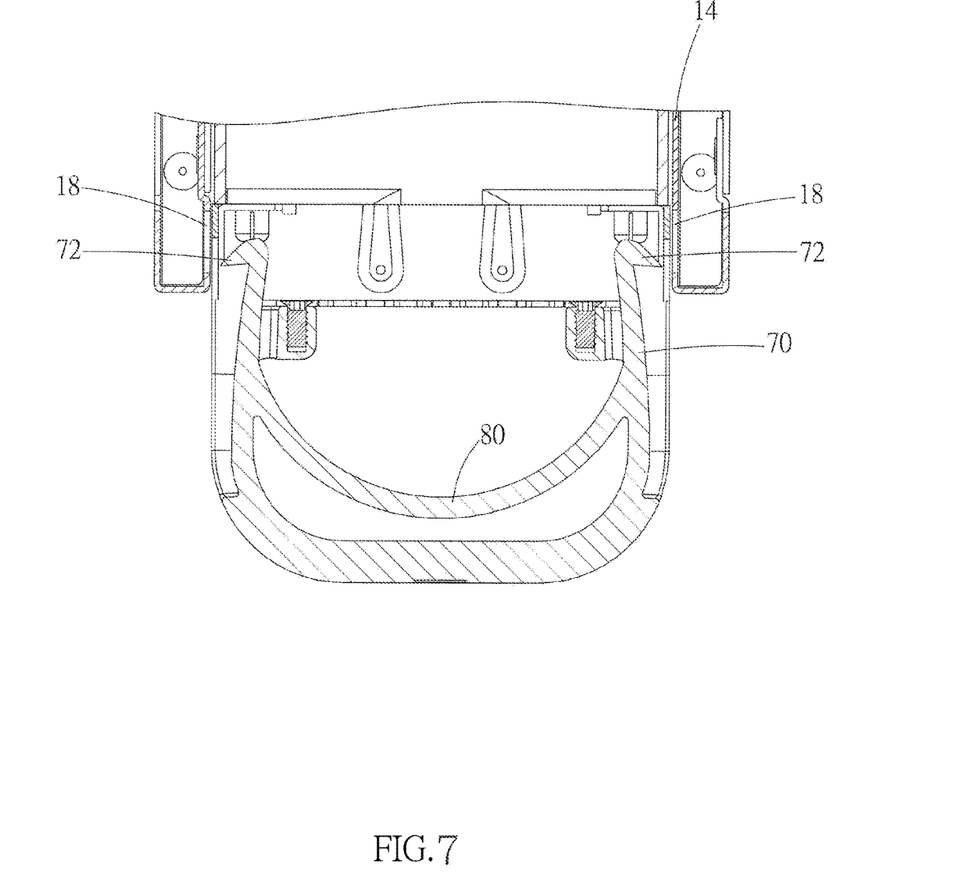

Referring to FIG. 1, FIG. 2, FIG. 6 and FIG. 7, when the user intends to remove the pluggable module 20 from the socket 16 of the frame body 10, the user could put fingers into a space between the force-bearing arm 80 and the back plate 32, and pull the handle 40 backwardly (it is shown in FIG. 6 that the handle 40 is pulled downwardly) to provide a force to the force-bearing arm 80. As shown in FIG. 7, the force-bearing arm 80 would drive the two elastic arms 70 to shift toward each other while the force is applied thereto, and thereby to retract the hook sections 72 of the two elastic arms 70 inwardly as being close to each other such that the hook sections 72 could be detached from the two positioning structures (that is, the through holes 18) respectively. In this way, the user could remove the pluggable module 20 from the socket 16 of the frame body 10. The aforementioned steps are quite simple that the user could instinctively pull the force-bearing arm 80 of the handle 40 to remove the pluggable module 20 directly. In addition, an outside of the hook section 72 has an inclined surface 74. When the user intends to install the pluggable module 20 into the socket 16 of the frame body 10, the user could insert one end of the pluggable module 20 into the socket 16 and then push the pluggable module 20 to make the inclined surfaces 74 of the hook sections 72 slide along the two lateral partitions 14 of the socket 16, and meanwhile, the two elastic arms 70 would be gradually retracted inwardly to be close to each other until the hook sections 72 pass through the through holes 18 of the partitions 14, which enables the two elastic arms 70 to release elastically and rebound automatically. In this way, the hook sections 72 would respectively extend out of the through holes 18 of the two lateral partitions 14 to be engaged with the through holes 18. Whereby, the pluggable module 20 could be firmly fixed to the socket 16.

With the aforementioned design, since the handle is integrally formed as a monolithic unit and has a simple structure, the assembling procedure could be simplified and the manufacturing cost could be saved as well. Moreover, the pluggable module could be assembled with the frame body simply by instinctively pushing the pluggable module into the socket of the frame body, and then the pluggable module could be firmly fixed to the socket; the pluggable module could be removed from the frame body simply by instinctively pulling the handle, and the pluggable module could be removed from the socket of the frame body directly, which is convenient for operation.

It must be pointed out that the embodiments described above are only some embodiments of the present invention. All equivalent structures which employ the concepts disclosed in this specification and the appended claims should fall within the scope of the present invention.

What is claimed is:

1. A handle, comprising:
    two elastic arms, each of which including a hook section; and
    a force-bearing arm, connected between the two elastic arms, wherein the two elastic arms shift toward each other when a force is applied to the force-bearing arm.

2. The handle of claim 1, further comprising a main body, wherein each of two lateral sections of the main body includes an opening groove which is formed with a sub arm protruding therefrom; the two sub arms are respectively connected to the two elastic arms and respectively connected to two opposite ends of the force-bearing arm as well.

3. The handle of claim 2, wherein the main body further comprises a holding arm connected between the two sub arms, and the force-bearing arm is located between the two elastic arms and the holding arm; one side of the holding arm away from the two elastic arms is formed with a labelling part.

4. The handle of claim 2, wherein the two lateral sections of the main body are further respectively disposed with a first positioning part.

5. A pluggable module, comprising:
    a rack, adapted to receive an electronic module; each of two lateral sides of the rack is disposed with a pass-through section; and
    a handle, including two elastic arms and a force-bearing arm; each of the two elastic arms includes a hook section, wherein the two hook sections respectively pass through the pass-through sections; the force-bearing arm is connected between the two elastic arms, and the two elastic arms shift toward each other when a force is applied to the force-bearing arm.

6. The pluggable module of claim 5, wherein the handle further comprises a main body; each of two lateral sections of the main body includes an opening groove which is formed with a sub arm protruding therefrom; the two sub arms are respectively connected to the two elastic arms and respectively connected to two opposite ends of the force-bearing arm as well.

7. The pluggable module of claim 6, wherein the main body further comprises a holding arm connected between the two sub arms, and the force-bearing arm is located between the two elastic arms and the holding arm; one side of the holding arm away from the two elastic arms is formed with a labelling part.

8. The pluggable module of claim 7, wherein the two lateral sections of the main body are further respectively disposed with a first positioning part; the rack is further disposed with two second positioning parts corresponding to the first positioning parts, wherein the two second positioning parts are adapted to be engaged with the two first positioning parts respectively.

9. The pluggable module of claim 5, wherein each of the pass-through sections of the rack comprises a first slot and a second slot; the first slots are adapted to be passed through by the elastic arms respectively, and the second slots are adapted to be passed through by the hook sections respectively.

10. An electronic apparatus, comprising:
    a plurality of pluggable modules of claim 5; and
    a frame body, including a plurality of sockets corresponding to the plurality of pluggable modules, wherein each of the sockets is respectively formed with a positioning structure at two sides thereof, and wherein the plurality of pluggable modules are detachably received in the plurality of sockets, whereby the two hook sections of the handle of each of the plurality of pluggable modules are adapted to be engaged with the positioning structures, and the two elastic arms of the handle shift toward each other to enable the two hook sections to be detached from the positioning structures when a force is applied to the force-bearing arm of the handle.

11. An electronic apparatus, comprising:
    a plurality of pluggable modules of claim 6; and
    a frame body, including a plurality of sockets corresponding to the plurality of pluggable modules, wherein each of the sockets is respectively formed with a positioning structure at two sides thereof, and wherein the plurality of pluggable modules are detachably received in the plurality of sockets, whereby the two hook sections of the handle of each of the plurality of pluggable modules are adapted to be engaged with the positioning structures, and the two elastic arms of the handle shift toward each other to enable the two hook sections to be detached from the positioning structures when a force is applied to the force-bearing arm of the handle.

12. An electronic apparatus, comprising:
a plurality of pluggable modules of claim 7; and
a frame body, including a plurality of sockets corresponding to the plurality of pluggable modules, wherein each of the sockets is respectively formed with a positioning structure at two sides thereof, and wherein the plurality of pluggable modules are detachably received in the plurality of sockets, whereby the two hook sections of the handle of each of the plurality of pluggable modules are adapted to be engaged with the positioning structures, and the two elastic arms of the handle shift toward each other to enable the two hook sections to be detached from the positioning structures when a force is applied to the force-bearing arm of the handle.

13. An electronic apparatus, comprising:
a plurality of pluggable modules of claim 8; and
a frame body, including a plurality of sockets corresponding to the plurality of pluggable modules, wherein each of the sockets is respectively formed with a positioning structure at two sides thereof, and wherein the plurality of pluggable modules are detachably received in the plurality of sockets, whereby the two hook sections of the handle of each of the plurality of pluggable modules are adapted to be engaged with the positioning structures, and the two elastic arms of the handle shift toward each other to enable the two hook sections to be detached from the positioning structures when a force is applied to the force-bearing arm of the handle.

14. An electronic apparatus, comprising:
a plurality of pluggable modules of claim 9; and
a frame body, including a plurality of sockets corresponding to the plurality of pluggable modules, wherein each of the sockets is respectively formed with a positioning structure at two sides thereof, and wherein the plurality of pluggable modules are detachably received in the plurality of sockets, whereby the two hook sections of the handle of each of the plurality of pluggable modules are adapted to be engaged with the positioning structures, and the two elastic arms of the handle shift toward each other to enable the two hook sections to be detached from the positioning structures when a force is applied to the force-bearing arm of the handle.

\* \* \* \* \*